(12) United States Patent  
DeForge et al.

(10) Patent No.: US 6,570,254 B1
(45) Date of Patent: May 27, 2003

(54) ELECTRICAL MASK IDENTIFICATION OF MEMORY MODULES

(75) Inventors: John B. DeForge, Barre, VT (US); David E. Douse, Hinesburg, VT (US); Steven M. Eustis, Essex Junction, VT (US); Erik L. Hedberg, Essex Junction, VT (US); Susan M. Litten, Jericho, VT (US); Endre P. Thoma, Colchester, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/871,087

(22) Filed: May 31, 2001

Related U.S. Application Data

(62) Division of application No. 09/238,874, filed on Jan. 27, 1999, now Pat. No. 6,268,228.

(51) Int. Cl.[7] .................. H01L 23/48; H01L 23/52; H01L 29/40
(52) U.S. Cl. .................................................. 257/758
(58) Field of Search .................. 257/209, 390, 257/391, 508, 758–760, 210–211, 48, 797

(56) References Cited

U.S. PATENT DOCUMENTS

| | | | | |
|---|---|---|---|---|
| 3,602,898 A | * | 8/1971 | Pain et al. ................ 711/200 |
| 4,028,528 A | * | 6/1977 | Staes ........................ 235/454 |
| 4,419,747 A | | 12/1983 | Jordan | |
| 4,451,903 A | | 5/1984 | Jordan | |
| 4,871,903 A | * | 10/1989 | Carrell ..................... 235/375 |
| 4,969,169 A | * | 11/1990 | Forsyth et al. ............. 378/34 |
| 4,980,896 A | * | 12/1990 | Forsyth et al. ............ 372/101 |
| 5,043,657 A | | 8/1991 | Amazeen et al. | |
| 5,051,374 A | * | 9/1991 | Kagawa et al. ............ 438/449 |
| 5,059,899 A | | 10/1991 | Farnworth et al. | |
| 5,103,166 A | | 4/1992 | Jeon et al. | |
| 5,187,118 A | | 2/1993 | Ohmori et al. | |
| 5,323,440 A | * | 6/1994 | Hara et al. ................. 378/34 |
| 5,422,581 A | * | 6/1995 | Mahant-Shetti et al. .... 326/50 |
| 5,448,090 A | * | 9/1995 | Geissler et al. ............ 257/305 |
| 5,502,404 A | * | 3/1996 | Landers et al. ............. 326/50 |
| 5,602,492 A | | 2/1997 | Cresswell et al. | |
| 5,642,307 A | | 6/1997 | Jernigan | |
| 5,665,616 A | * | 9/1997 | Kimura et al. ............. 438/234 |
| 5,677,917 A | | 10/1997 | Wheelus et al. | |
| 5,831,280 A | * | 11/1998 | Ray ............................ 257/48 |
| 5,856,101 A | * | 1/1999 | Hubbell et al. .............. 435/6 |
| 5,859,552 A | * | 1/1999 | Do et al. .................... 327/170 |
| 5,984,190 A | | 11/1999 | Nevill | |
| 5,998,821 A | * | 12/1999 | Hieda et al. ............... 257/301 |
| 6,054,339 A | | 4/2000 | Gilmour et al. | |
| 6,190,972 B1 | * | 2/2001 | Zheng et al. .............. 438/275 |
| 6,271,542 B1 | * | 8/2001 | Emma et al. ............... 257/67 |
| 2002/0054398 A1 | * | 5/2002 | Bloomquist et al. ....... 358/529 |
| 2002/0116984 A1 | * | 8/2002 | Tilley ........................ 73/40 |

* cited by examiner

*Primary Examiner*—Amir Zarabian
*Assistant Examiner*—Ida M. Soward
(74) *Attorney, Agent, or Firm*—DeLio & Peterson, LLC; Robert Curcio; Anthony Canale

(57) ABSTRACT

Mask programmable conductors of the same construction as the mask layers they define are utilized for mask vintage identification. When the actual mask layer is altered, the change is recorded within the mask itself.

Mask identification can be fabricated to identify the following type of mask layers: DT—deep trench; SS—surface strap; DIFF—Diffusion; NDIFF—N Diffusion; PDIFF—P Diffusion; WL—N wells; PC—polysilicon gates; BN—N diffusion Implant; BP—P diffusion Implant; C1—first contact; M1—first metal layer; C2—second contact; and, M2—second metal layer.

Conducting paths that incorporate, in series, the mask programmable conductor technology devices are: M1-C1-PC-C1-DIFF-C1-M1-C2-M2; M1-C1-PDIFF-SS-DT-SS-PDIFF-C1-M1-C2-M2; M2-C2-M1-C1-PC-C1-M1; M2-C2-M1-C1-NDIFF-WL-NDIFF-C1-M1; and, M2-C2-M1-C1-NDIFF-C1-M1-C1-PC-C1-M1. These conducting paths are electrically opened with the omission of any of the layers in the series path.

13 Claims, 6 Drawing Sheets

ELECTRICAL MASK IDENTIFICATION OF MEMORY MODULES

This application is a Division of application Ser. No. 09/238,874, filed Jan. 27, 1999, now U.S. Pat. No. 6,268,228.

BACKGROUND OF THE INVENTION

1. Field of the Invention

The present invention relates generally to semiconductor devices, and more particularly to a method for electrically identifying mask vintages in semiconductor memory modules.

2. Description of Related Art

Mask identification remains important to several areas of design and manufacturing. In the design of semiconductor components, each design update requires confirmation that the correct mask vintages were used. This can be achieved by characterizing the exact vintage of each chip/module being tested. In manufacturing testing, the ability to separate different chip vintages facilitates identifying the pedigree of the devices under test for subsequent investigation. Similarly, in engineering failure analysis, the ability to know the mask vintage without resorting to visual identification remains beneficial to the investigating engineer.

After processing, testing, and packaging, it is difficult to keep track of particular mask changes and variations from lot to lot, or wafer to wafer. Typically, paper records of changes are employed to maintain the current status of each mask, however, these records often remain incomplete, requiring significant cost to keep current.

Visual mask marks, added to the surface of memory chips, have been used for a number of years to identify the mask vintage of fabricated semiconductor devices. This visual method, however, is only successful if the surface of the chip remains visible throughout the chip's fabrication.

Other methods, such as etching the surface of the semiconductor wafer to form visibly identifiable characters, have also been employed for the purpose of identifying the fabrication status of the wafer.

Recent advances in characterizing semiconductor dies have been realized using electrical identification. In some instances, fusible links have been used in a readable binary fashion for coding the status of semiconductor devices.

Methods to electrically interrogate a test circuit on a semiconductor chip containing fabrication information have become more prevalent due, in part, to their ability to encode more information within a smaller area of the die. Additionally, different types of electrical identification methods have been introduced which are more adaptable to accommodating the numerous changes during the device fabrication process. For example, in U.S. Pat. No. 4,419,747 issued to Jordan on Dec. 6, 1983, entitled, "METHOD AND DEVICE FOR PROVIDING PROCESS AND TEST INFORMATION IN SEMICONDUCTORS," a memory array on the chip is modified to include processing and test information. The array is typically a non-volatile EEPROM type, however, fusible-link devices or laser blown fuses are also known in the art for such construction. With this technique, product information disclosed may include fabrication lot number, wafer number, and the array location within the die, referred to as the die position number. Although not a common practice, mask vintages may also be recorded using this technique since the binary encoded format is capable of alternative designations. However, in all of the above fuse or array constructions, the components are fabricated separately, from technologies other than those used to fabricate the mask, thus requiring extra process steps during fabrication.

Similarly, in U.S. Pat. No. 5,642,307 issued to Jernigan on Jun. 24, 1997, entitled, "DIE IDENTIFIER AND DIE IDENTIFICATION METHOD," an identification section is fabricated onto a semiconductor that includes structure for storing and reading die-specific information that characterizes the particular integrated circuit. The structure for storing is a memory section, typically non-volatile, or may also be fuse-programmable. An enabling circuit initiates the reading structure for interrogating the memory or fuse devices. Although capable of designating mask vintage information, this method requires additional device fabrication of various technologies to employ the memory or fuse-programmable circuitry necessary to retain the semiconductor fabrication status information. Thus, there remains a need in the art to reduce the complexity associated with encoding semiconductor fabrication information on a device, and especially for encoding mask vintage information.

Bearing in mind the problems and deficiencies of the prior art, it is therefore an object of the present invention to provide a method of identifying unique design characteristics of semiconductor mask levels.

It is another object of the present invention to provide an identification section on a semiconductor device for storing die specific information using the available mask technology.

A further object of the invention is to provide an inexpensive, reliable device for providing identification of design characteristics and other key parameters of semiconductors.

It is yet another object of the present invention to provide a method, whereby mask vintage information for a semiconductor device may be obtained through electrical interrogation of the device.

Still other advantages of the invention will in part be obvious and will in part be apparent from the specification.

SUMMARY OF THE INVENTION

The above and other objects and advantages, which will be apparent to one of skill in the art, are achieved in the present invention which is directed to, in a first aspect, a method for identifying design characteristics of a semiconductor device, comprising the steps of: a) providing the semiconductor device having a plurality of semiconductor levels of different semiconductor technologies; and, b) forming electrical devices from each of the semiconductor technologies within each of the semiconductor levels.

Additionally, step (b) comprises forming conduction paths made from the different semiconductor technologies.

The method may further comprise the steps of: c) encoding the electrical devices in a binary encoded format to identify the design characteristics; and, d) electrically interrogating the semiconductor device for the design characteristics by reading the binary encoded electrical devices.

Step (c) may further comprise changing the conduction paths such that electrical opens and shorts in the conduction paths provide the binary encoded format for identifying the design characteristics.

The present invention relates to, in a second aspect, a method for identifying mask vintage of a semiconductor device, comprising: a) providing a semiconductor substrate having a plurality of semiconductor layers with different semiconductor technologies; b) fabricating at least one conductor for each of the plurality of semiconductor layers using the semiconductor technology of each layer; c) encoding the at least one conductor in a binary encoded format to identify the mask vintage; and, d) electrically interrogating the semiconductor device for the mask vintage by reading the binary encoded conductors.

In a third aspect, the present invention relates to a method for identifying mask vintage of a deep trench and surface strap structure on a semiconductor device, comprising: a) providing a semiconductor substrate having a plurality of semiconductor layers of different semiconductor technologies; b) forming a conduction path of conductors for each layer of the deep trench and surface strap structure, wherein each of the conductors is fabricated from the semiconductor technology of each layer of the structure, the conduction path comprising: 1) connecting electrically conductive surface strap conductors on adjacent sides of the deep trench; 2) forming diffusion conductors for attachment to each of the surface strap conductors; 3) forming a first contact to each of the diffusion conductors; 4) electrically connecting non-contiguous first metal layer conductors to each of the first contacts; 5) forming a second contact to one of the first metal layer conductors; and, 6) forming a second metal layer conductor for electrical connection to the second contact; c) encoding the conduction path in a binary encoded format to identify the mask vintage; and, d) electrically interrogating the semiconductor device for the mask vintage by reading the binary encoded conduction path.

In addition, the surface strap conductors and the first contacts may be separated by a PFET transistor.

In a fourth aspect, the present invention relates to an apparatus for identifying the mask vintage of a semiconductor device, comprising: a semiconductor device having a plurality of semiconductor levels of different semiconductor technologies; and, electrical devices constructed from each of the semiconductor technologies within each of the semiconductor levels, wherein the electrical devices form a mask programmable conduction path within the semiconductor device.

Additionally this method further comprises: means for encoding the electrical devices in a binary encoded format to identify the mask vintage; and, means for electrically interrogating the semiconductor device for the mask vintage by reading the binary encoded electrical devices.

In a fifth aspect, the present invention relates to an apparatus for identifying the mask vintage of a deep trench and surface strap structure, comprising a mask programmable conduction path fabricated from the technology of each of the following layers: a first metal layer, a first contact layer, a diffusion layer, a surface strap layer, a deep trench layer, a second contact layer, and a second metal layer. The apparatus may further comprise a third contact layer and a third metal layer.

In a sixth aspect, the present invention relates to an apparatus for identifying the mask vintage of a polysilicon gate structure, comprising a mask programmable conduction path fabricated from the technology of each of the following layers: a first metal layer, a first contact layer, a polysilicon gate layer, a second contact layer, and a second metal layer.

In a seventh aspect, the present invention relates to an apparatus for identifying the mask vintage of N Well and N Diffusion Implant structures, comprising a mask programmable conduction path fabricated from the technology of each of the following layers: a first metal layer, a first contact layer, a diffusion layer, a diffusion N Well layer, a second contact layer, and a second metal layer.

In an eighth aspect, the present invention relates to an apparatus for identifying the mask vintage of a substrate P-diffusion structure, comprising a mask programmable conduction path fabricated from the technology of each of the following layers: a first metal layer, a first contact layer, and a P diffusion layer.

In a ninth aspect, the present invention relates to an apparatus for identifying the mask vintage of a diffusion structure, first and second metal structures, first and second contact structures, comprising a mask programmable conduction path fabricated from the technology of each of the following layers: a first metal layer, a first contact layer, a polysilicon gate layer, a diffusion layer, a second contact layer, and a second metal layer.

BRIEF DESCRIPTION OF THE DRAWINGS

The features of the invention believed to be novel and the elements characteristic of the invention are set forth with particularity in the appended claims. The figures are for illustration purposes only and are not drawn to scale. The invention itself, however, both as to organization and method of operation, may best be understood by reference to the detailed description which follows taken in conjunction with the accompanying drawings in which:

DESCRIPTION OF THE PREFERRED EMBODIMENT(S)

Figure 1:
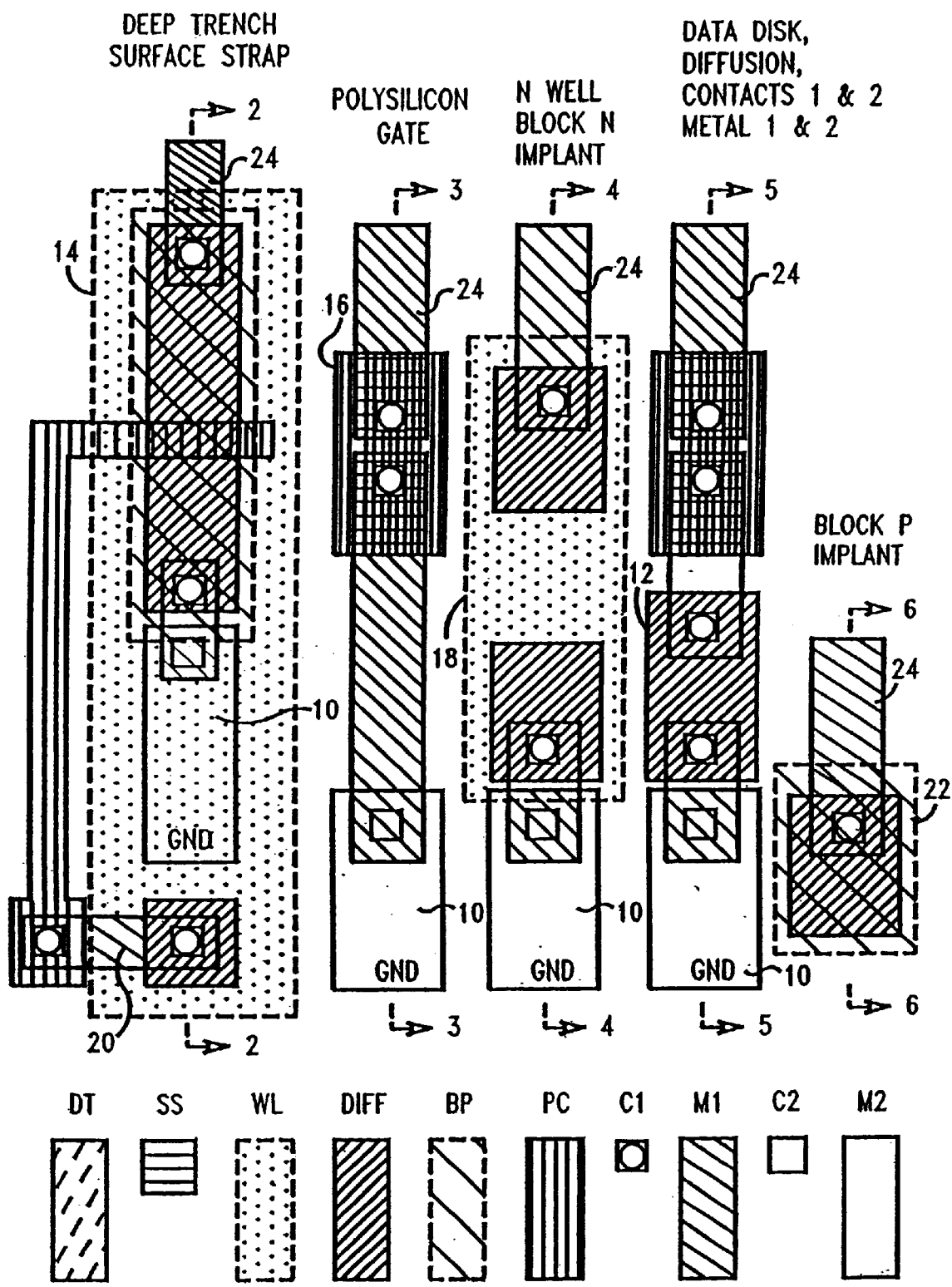
FIG. 1 illustrates the top view of various conductor combinations used as mask programmable conductors constructed from the same material as each semiconductor layer.

In describing the preferred embodiment of the present invention, reference will be made herein to FIGS. 1–6 of the drawings in which like numerals refer to like features of the invention. Features of the invention are not necessarily shown to scale in the drawings.

In the current art, mask vintage information of semiconductor devices is unavailable unless the chips are de-packaged and visually inspected. Electrical interrogation of mask programmable conductors requires the added process steps of integrating different conductor technologies on the semiconductor substrate.

The present invention employs mask programmable conductors for mask vintage identification that are of the same construction as the mask layers they are employed to define. Thus, if the actual mask layer is altered, e.g., a shape change, a diffusion change, etc., this change can be recorded within the mask itself. The electrical readout of this identification scheme is similar to that of any fuse-programmable device. The make-up of the fuse technology, however, is restricted to the technology of the appropriate mask layer being changed. With an equivalent mask programmable conductor fabricated from the technology of the appropriate layer, and within this layer, mask identification can be accomplished in a simple bit binary fashion. Preferably, no more than three bits are required to identify the different alterations of a mask layer (three bits yielding eight possible configuration changes).

The various conductors, constructed from diffusion, polysilicon, or metal are programmed by either having a conduction path or an open path. This is done by manipulating the graphics data on the data level of interest. The result is a means to electrically determine which data levels have been manipulated. For example, mask identification may be built to identify the following type of mask layers: DT—deep trench; SS—surface strap; DIFF—Diffusion; NDIFF—N Diffusion; PDIFF—P Diffusion; WL—N wells; PC—polysilicon gates; BN—N diffusion Implant; BP—P diffusion Implant; C1—first contact; M1—first metal layer; C2—second contact; and, M2—second metal layer.

Most of the conducting structures used as identification bits are built with several conductors in series to permit flexibility in usage. An example of this can be illustrated by a conducting path that incorporates, in series, the following mask programmable conductor technology devices: M1-C1-PC-C1-DIFF-C1-M1-C2-M2. This conducting path may be opened with the omission of any of the layers in the series path.

Alternatively, this design may accommodate an opposite polarity substrate (n-type versus p-type), where the electrical polarity logic would necessarily be reversed.

FIG. 1 illustrates the various conductors used as mask programmable conductors constructed from the same technology as the mask layer. Each one is shown connected at one end to ground potential 10 and at the other end to input 24. The various configurations depict the layering capability of these devices. Items 12, 14, 16, 18 and 22 represent different conductor configurations. For example, conductor 12 represents a M1-C1-PC-C1-M1-C1-DIFF-C1-M1-C2-M2 electrical conduction path. The pairs of numbers 2—2, 3—3, 4—4, 5—5, and 6—6 show where the cross-sections are taken for FIGS. 2, 3, 4, 5, and 6.

The structure for a deep trench and surface strap 14 can be configured to use the following path: M1-C1-DIFF-SS-DT-SS-DIFF-C1-M1-C2-M2. In this configuration, the two SS regions are separated by a PFET transistor. The DT structures are located within the drain-to-source ports of the PFET transistor.

Figure 2:
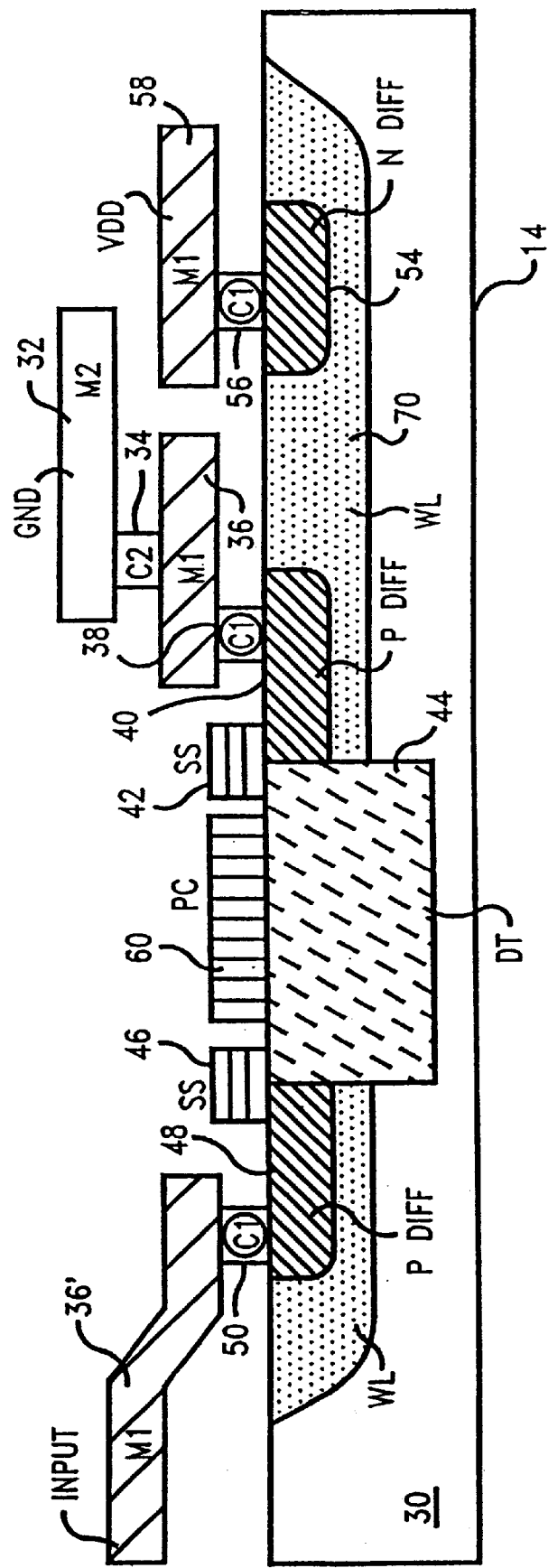
FIG. 2 depicts a cross-sectional view through the Deep Trench (DT) and Surface Strap (SS) structures.
Figure 3:
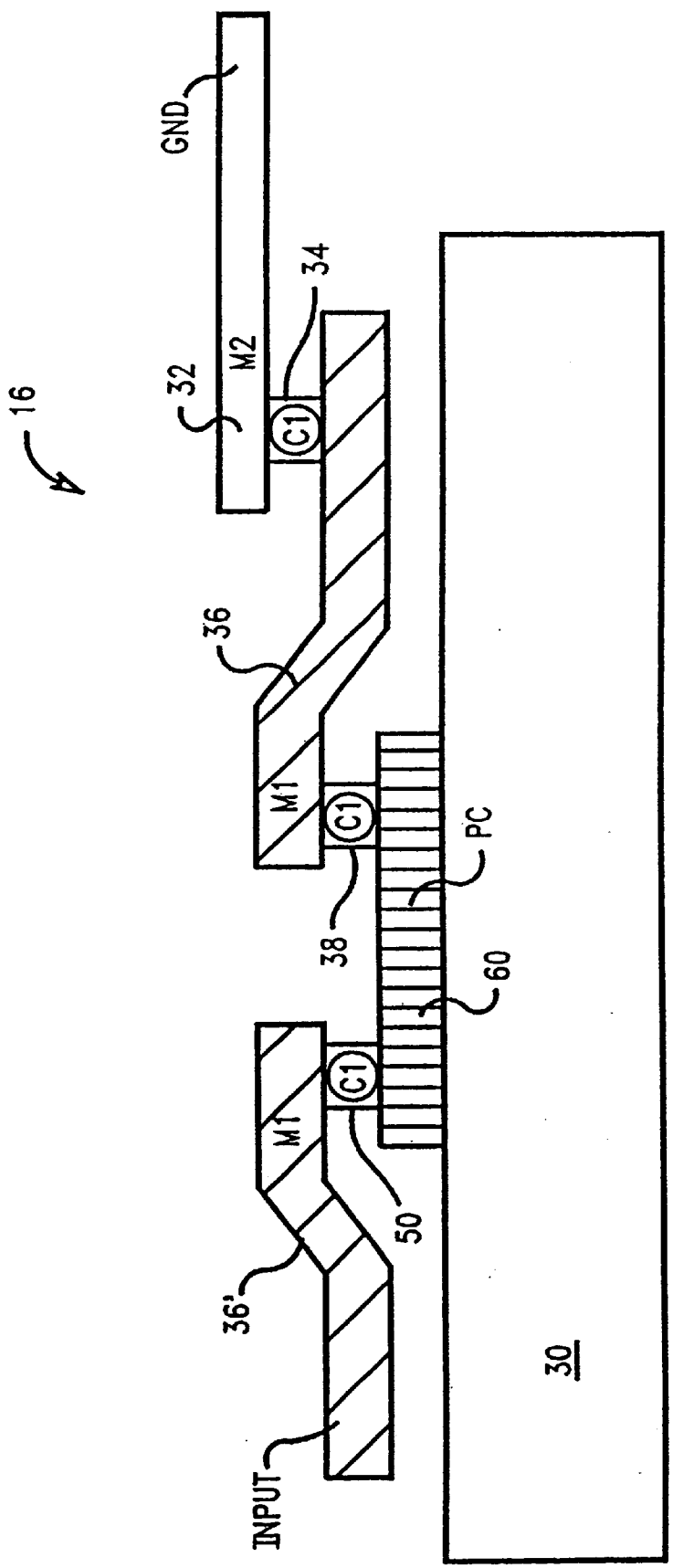
FIG. 3 depicts a cross-sectional view through a polysilicon gate (PC) structure.
Figure 4:
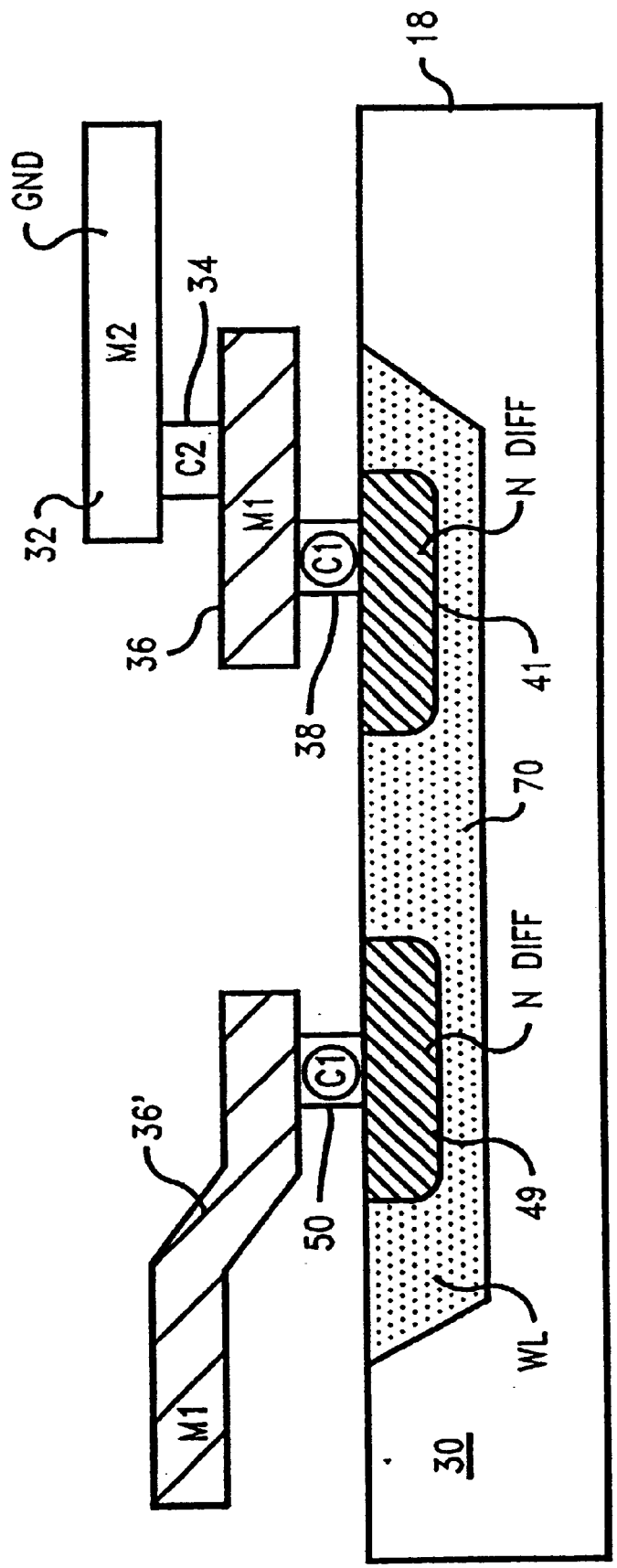
FIG. 4 depicts a cross-sectional view through an N Well (WL) and Block N Implant (BN) structure.
Figure 5:
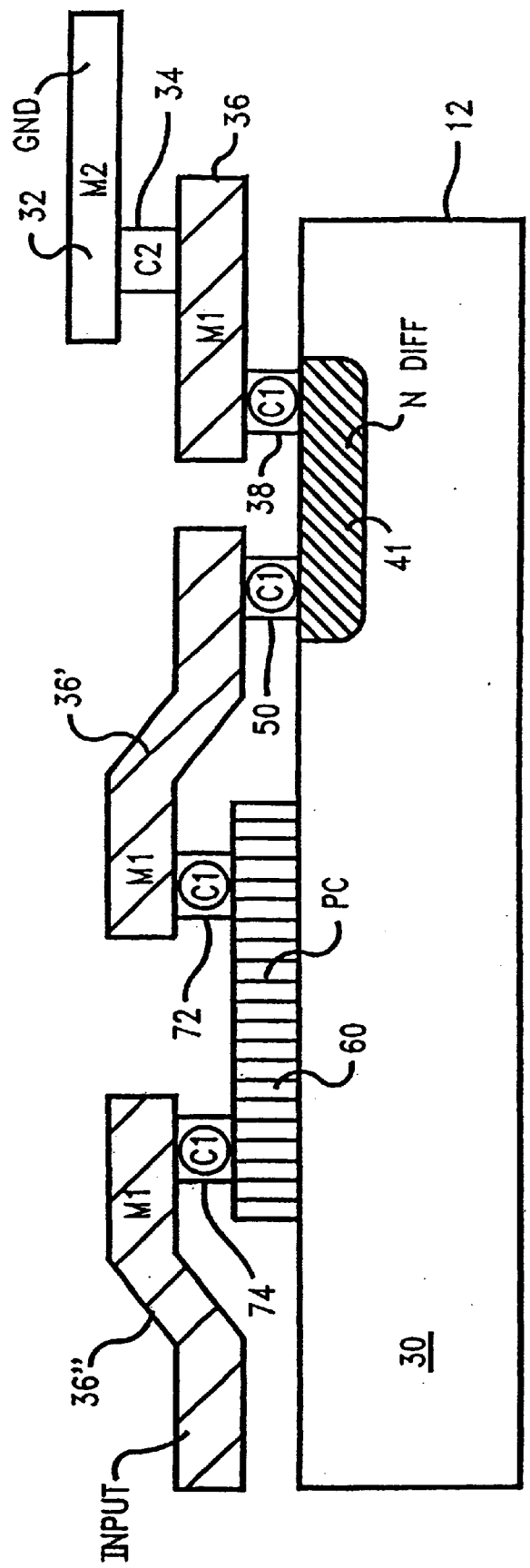
FIG. 5 depicts a cross-sectional view through a Data Disk Number (DD#), Diffusion (DIFF), and First Contact (C1)—First Metal (M1)—Second Contact (C2)—Second Metal (M2) structures.
Figure 6:
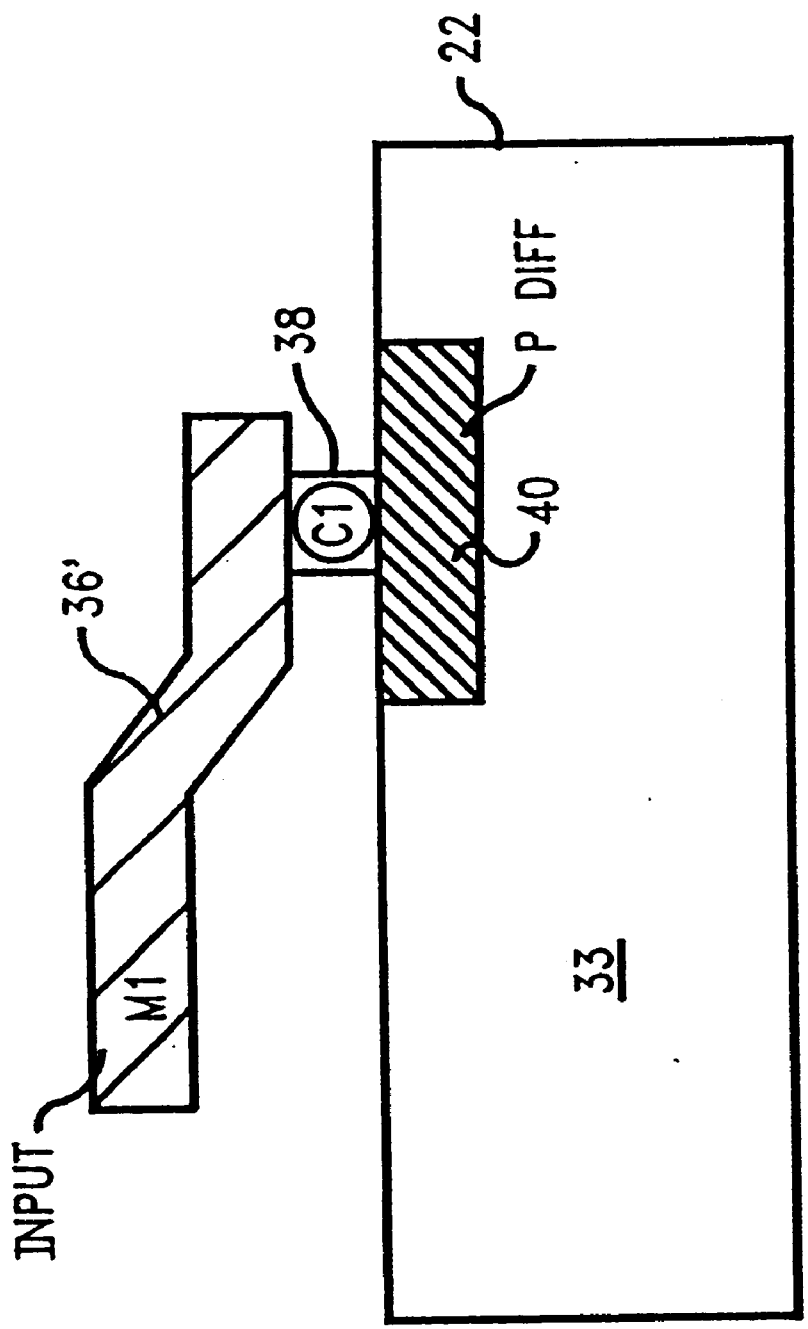
FIG. 6 depicts a cross-sectional view through a P-diffusion (PDIFF) structure.

The cross-section of the deep trench and surface strap structure 14 is shown in FIG. 2. Conductor 16 uses a polysilicon gate structure for mask programming. The cross-section of conductor 16 is shown in FIG. 3. Conductor 18 uses an N well and the Block N Implant mask for programming. The cross-section of conductor 18 is shown in FIG. 4. Conductor 12 uses multiple semiconductor structures to perform mask programming. The cross-section of conductor 12 is shown in FIG. 5. Conductor 22 uses Block P Implant for mask programming. The cross-section of conductor 22 is shown in FIG. 6.

FIG. 2 depicts a cross-sectional view through DT and SS structures residing on a silicon substrate 30, using the conducting path M1-C1-PDIFF-SS-DT-SS-PDIFF-C1-M1-C2-M2. Working in reverse order, the ground connection (M2) is identified in the figure as item 32. This ground is connected through a second contact (C2) 34 to the metal layer (M1) 36, which is connected to the P Diffusion (PDIFF) 40 through first contact (C1) 38. On either side of the deep trench (DT) 44 resides the surface straps (SS) 42, 46, which are electrically connected on one side to deep trench 44, and on the other side to the P Diffusions 40, 48.

P Diffusion 48 connects to metal layer (M1) 36' through first contact 50. On this side of the structure, metal layer 36' acts as the input to this conduction path.

The P Diffusions are located in an N Well (WL) 70 which is biased to voltage $V_{DD}$ through metal layer (M1) 58, first contact (C1) 56, and N Diffusion (NDIFF) 54. The Polysilicon gate (PC) 60 is also biased to voltage $V_{DD}$ to ensure that the PFET transistor (items 48, 60, and 40, collectively) is biased open. This same PFET—DT—SS structure can also be implemented in the complement version where an NFET transistor is used in place of the PFET. In this case, the NFET gate is biased to a low voltage to ensure that the NFET is biased open. The intended conduction path is through the SS and DT structures and not the transistor.

The conducting path in FIG. 2 is mask programmed by omitting at least one of the two surface straps 42, 46 to indicate a change to the surface strap mask, or by omitting the deep trench 44 to indicate a change to the deep trench mask. Either surface strap or deep trench omissions will cause an open in the conducting path. The open in the conducting path is then electrically sensed, and thus a mask change can be readily detected.

FIG. 3 depicts a cross-sectional view of a polysilicon gate (PC) structure, residing on silicon substrate 30. In this illustration, and in a similar fashion to the conduction path of FIG. 2, the conduction path consists of the following semiconductor technologies for mask programming: M2-C2-M1-C1-PC-C1-M1. Here, again, the ground connection (M2) 32 is the top metal layer of the conduction path. Second contact (C2) 34 connects the top or second metal layer (M2) 32 to the first metal layer (M1) 36. Metal layers 36, 36' connect on each side of the polysilicon gate (PC) 60 through first contacts 38 and 50. On one side of the polysilicon gate, metal layer (M1) 36' acts as the input to this conduction path.

The conducting path of FIG. 3 is mask programmed by cutting the polysilicon gate conductor 60 into two segments to cause an electrical open. The central portion of the polysilicon gate 60 is omitted (not shown).

FIG. 4 depicts a cross-section through N Well (WL) and Block N Implant (BN) structures. In this example the N Well diffusion is of N type implant and the BN mask is used in the formation of the N Diffusion (NDIFF) 41, 49 regions. The entire conducting path is constructed on and within substrate 30. The conducting path consists of the following semiconductor technologies for mask programming: M2-C2-M1-C1-NDIFF-WL-NDIFF-C1-M1. As depicted in the preceding figures, ground connection (M2) 32 is connected to second contact (C2) 34, which in turn is connected to metal layer (M1) 36. The N Diffusions (NDIFF) 41, 49 are embedded within an N Well (WL) structure 70, and connect on each side of the WL structure 70 through first contacts (C1) 38, 50, to metal layer (M1) 36, 36'. On one side of WL structure 70, the metal layer 36' acts as the input to this conduction path.

To mask program the conducting path for a change to the N Well (WL) mask, WL 70 is omitted to cause an electrical open between the two N Diffusions (NDIFF) 41, 49. To mask program the conduction path in FIG. 4 for a change to the Block N Implant (BN) mask, diffusion 41 is changed from an N Diffusion to a P Diffusion to cause an electrical open.

FIG. 5 illustrates a conduction path through DD#, DIFF, and C1-M1-C2-M2 structures. The DD# which refers to Data Disk Number (or data version number) is a flexible capability of the mask programmable structures to provide mask data through electrical interrogation without the use of conventional fuse blow technology. The conduction path in FIG. 5 permits numerous mask layers to be adapted for programmable input. The complete path is represented by the following: M2-C2-M1-C1-NDIFF-C1-M1-C1-PC-C1-M1.

As previously illustrated, the ground connection and input are the two metal layers 32 and 36", respectively. The ground (M2) 32 connects, in series, to a second contact (C2) 34, a metal layer (M1) 36, and a first contact (C1) 38 which connects to an N Diffusion (NDIFF) 41 embedded within the substrate 30. The opposite side of the N Diffusion 41 connects, via first contact 50, to the M1 metal layer segment 36'. The electrical conduction path continues from metal layer 36' through first contact 72 to polysilicon gate 60, residing on the surface of silicon substrate 30. The adjacent end of the polysilicon gate 60 is connected to input M1 metal layer segment 36" through first contact 74.

The conducting path in FIG. 5 is mask programmed by omitting contacts C1 or C2, or by cutting either the polysilicon conductor 60, the metal layer 36', or the N Diffusion 41 into segments. The metal conductor 32 may also be cut away from the bias connection to ground. Each conductor may be modified using the respective mask to accomplish the electrical open.

FIG. 6 depicts a cross-sectional view of a substrate to P Diffusion conducting path. In this example the substrate 33 is constructed with P-type semiconductor materials and a bias voltage at ground is assumed. The conduction path is represented by the following: substrate-PDIFF-C1-M1. M1 represents metal layer 36' used as the input, connecting to P Diffusion (PDIFF) 40 through first contact 38. The BP mask can program this structure by changing the P Diffusion to N Diffusion, establishing an open electrical path from input 36' to substrate 33 ground.

Thus, through these diverse conduction paths, a mask vintage identification structure can be fabricated, using the technology of each mask layer as a basis for mask programmable conductors. This will enable electrical identification of mask vintage, without the need for visual inspection. Additionally, the present method of fabricating conduction paths utilizing current mask technology will simplify process steps while maintaining accurate mask pedigree information.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

Thus, having described the invention, what is claimed is:

1. An apparatus for identifying the mask vintage of a semiconductor device, comprising:
   a semiconductor device having a plurality of semiconductor levels of different semiconductor technologies; and
   electrical devices constructed from each of said semiconductor technologies within each of said semiconductor levels, wherein said electrical devices form a mask programmable conduction path for mask identification within said semiconductor device.

2. The apparatus of claim 1 further comprising:
   means for encoding said electrical devices in a binary encoded format to identify said mask vintage; and,
   means for electrically interrogating said semiconductor device for said mask vintage by reading the binary encoded electrical devices.

3. An apparatus for identifying the mask vintage of a deep trench and surface strap structure, comprising a mask programmable conduction path for mask identification within said semiconductor device, said conduction path fabricated from the technology of each of the following layers: a first metal layer, a first contact layer, a diffusion layer, a surface strap layer, a deep trench layer, a second contact layer, and a second metal layer.

4. The apparatus of claim 3 further comprising a third contact layer and a third metal layer.

5. An apparatus for identifying the mask vintage of a polysilicon gate structure, comprising a mask programmable conduction path for mask identification within said semiconductor device, said conduction path fabricated from the technology of each of the following layers: a first metal layer, a first contact layer, a polysilicon gate layer, a second contact layer, and a second metal layer.

6. The apparatus of claim 5 further comprising a third contact layer and a third metal layer.

7. An apparatus for identifying the mask vintage of N Well and N Diffusion Implant structures, comprising a mask programmable conduction path for mask identification within said semiconductor device, said conduction path fabricated from the technology of each of the following layers: a first metal layer, a first contact layer, a diffusion layer, a diffusion N Well layer, a second contact layer, and a second metal layer.

8. The apparatus of claim 5 further comprising a second deeper diffusion N Well layer.

9. The apparatus of claim 7 further comprising a third contact layer and a third metal layer.

10. An apparatus for identifying the mask vintage of a substrate P-diffusion structure, comprising a mask programmable conduction path for mask identification within said semiconductor device, said conduction path fabricated from the technology of each of the following layers: a first metal layer, a first contact layer, and a p diffusion layer.

11. An apparatus for identifying the mask vintage of a diffusion structure, first and second metal structures, first and second contact structures, comprising a mask programmable conduction path for mask identification within said semiconductor device, said conduction path fabricated from the technology of each of the following layers: a first metal layer, a first contact layer, a polysilicon gate layer, a diffusion layer, a second contact layer, and a second metal layer.

12. The apparatus of claim 11 further comprising a third contact layer and a third metal layer.

13. An apparatus for identifying the mask vintage of a semiconductor device, comprising:
   a semiconductor device having a plurality of semiconductor levels of different semiconductor technologies;
   electrical devices constructed from each of said semiconductor technologies within each of said semiconductor levels, wherein said electrical devices form a mask programmable conduction path for mask identification within said semiconductor device; and
   circuitry for electrical interrogation of said electrical devices to access mask identification.

* * * * *